US010713997B2

(12) United States Patent
Goodson et al.

(10) Patent No.: US 10,713,997 B2
(45) Date of Patent: Jul. 14, 2020

(54) CONTROLLING IMAGE DISPLAY VIA MAPPING OF PIXEL VALUES TO PIXELS

(71) Applicant: Valve Corporation, Bellevue, WA (US)

(72) Inventors: Montgomery Vincent Goodson, Kirkland, WA (US); Yasser Malaika, Seattle, WA (US)

(73) Assignee: Valve Corporation, Bellevue, WA (US)

( * ) Notice: Subject to any disclaimer, the term of this patent is extended or adjusted under 35 U.S.C. 154(b) by 271 days.

(21) Appl. No.: 15/934,789

(22) Filed: Mar. 23, 2018

(65) Prior Publication Data

US 2019/0295455 A1 Sep. 26, 2019

(51) Int. Cl.
*G09G 3/30* (2006.01)
*H01L 27/32* (2006.01)
*H04N 19/44* (2014.01)
*H04N 19/80* (2014.01)
*H04N 21/6379* (2011.01)
*H04N 19/172* (2014.01)

(52) U.S. Cl.
CPC ............ *G09G 3/30* (2013.01); *H01L 27/3211* (2013.01); *H04N 19/172* (2014.11); *H04N 19/44* (2014.11); *H04N 19/80* (2014.11); *H04N 21/6379* (2013.01); *G09G 2300/0452* (2013.01)

(58) Field of Classification Search
None
See application file for complete search history.

(56) References Cited

U.S. PATENT DOCUMENTS

| 5,978,514 A | * | 11/1999 | Yamaguchi | .......... H04N 19/503 |
| | | | | 375/240.11 |
| 9,978,118 B1 | * | 5/2018 | Ozguner | ............ G02B 27/0103 |
| 2002/0009145 A1 | * | 1/2002 | Natarajan | ............ G06T 3/4007 |
| | | | | 375/240.21 |
| 2003/0138150 A1 | | 7/2003 | Srinivasan | |

(Continued)

OTHER PUBLICATIONS

International Search Report and Written Opinion for PCT application No. PCT/US2019/022299 dated May 24, 2019.

(Continued)

*Primary Examiner* — Kevin Ky
(74) *Attorney, Agent, or Firm* — Seed Intellectual Property Law Group LLP

(57) ABSTRACT

Techniques are described for controlling display of video data and/or other image data based at least in part on selective mapping of pixel values to pixels. Such techniques may include separating a display panel into multiple regions, with at least one primary region having a highest resolution of displayed image data and with one or more secondary regions having one or more lower resolutions of displayed image data (e.g., by using a 1-to-M mapping of image pixel values to display panel pixels for each such secondary region, where M is greater than 1, such that each such image pixel value controls the display of M such pixels). The image data may further be encoded and optionally decoded in accordance with such a display panel arrangement, such as to encode the image data per the display panel arrangement to reduce its size before transmission to the display panel.

31 Claims, 6 Drawing Sheets

(56) References Cited

U.S. PATENT DOCUMENTS

| | | | |
|---|---|---|---|
| 2005/0031199 A1* | 2/2005 | Ben-Chorin | G09G 5/02 |
| | | | 382/162 |
| 2007/0071344 A1 | 3/2007 | Ouzilevski et al. | |
| 2007/0120787 A1 | 5/2007 | Guttag | |
| 2010/0232767 A1* | 9/2010 | Sasaki | G11B 27/105 |
| | | | 386/341 |
| 2011/0194612 A1* | 8/2011 | Tsai | H04N 7/014 |
| | | | 375/240.16 |
| 2012/0002066 A1 | 1/2012 | Wang | |
| 2012/0183073 A1* | 7/2012 | Milstein | H04N 19/63 |
| | | | 375/240.19 |
| 2015/0358646 A1* | 12/2015 | Mertens | H04N 1/6058 |
| | | | 382/166 |
| 2018/0035134 A1* | 2/2018 | Pang | H04N 19/176 |
| 2018/0097867 A1* | 4/2018 | Pang | H04N 13/194 |
| 2018/0128973 A1* | 5/2018 | Powell | G02B 6/06 |
| 2018/0262758 A1* | 9/2018 | El-Ghoroury | H04N 19/44 |

OTHER PUBLICATIONS

Paalanen, "A programmer's view on digital images: the essentials", *Collabora*, Feb. 2, 2016, <https://www.collabora.com/news-and-blog/blog/2016/02/16/a-programmers-view-on-digital-images-the-essentials/>, 9 pages.

Guenter, B., et al., "Foveated 3D Graphics," Nov. 20, 2012, retrieved from https://www.microsoft.com/en-us/research/publication/foveated-3d-graphics/, 10 pages.

Foveated Rendering, retrieved from https://en.wikipedia.org/wiki/Foveated_rendering, Aug. 18, 2017, 2 pages.

* cited by examiner

CONTROLLING IMAGE DISPLAY VIA MAPPING OF PIXEL VALUES TO PIXELS

TECHNICAL FIELD

The following disclosure relates generally to techniques for controlling display of image data on a display panel, and more specifically to techniques for mapping of pixel values to pixels of the display panel.

BACKGROUND

Demand for increasing visual display resolution has resulted in large corresponding increases in image data size and associated transmission bandwidth usage. For example, higher transmission bandwidths have resulted from increasing visual display resolution in gaming devices, video display devices, mobile computing, general purpose computing, etc. In addition, the growing popularity of virtual reality ("VR") and augmented reality ("AR") systems, particularly those using head mounted displays, has further increased such demand. Virtual reality systems typically envelop a wearer's eyes completely and substitute a "virtual" reality for the actual view (or actual reality) in front of the wearer, while augmented reality systems typically provide a semi-transparent or transparent overlay of one or more screens in front of a wearer's eyes such that an actual view is augmented with additional information.

However, such head mounted displays, with reduced distance between a viewer's eye and the display and often with a fully obscured field of view, have increased the performance requirements of displays in ways that traditional display and transmission capabilities cannot satisfy, while also often focusing a wearer's gaze and attention on only a portion of the display.

DETAILED DESCRIPTION

Figure 1A:
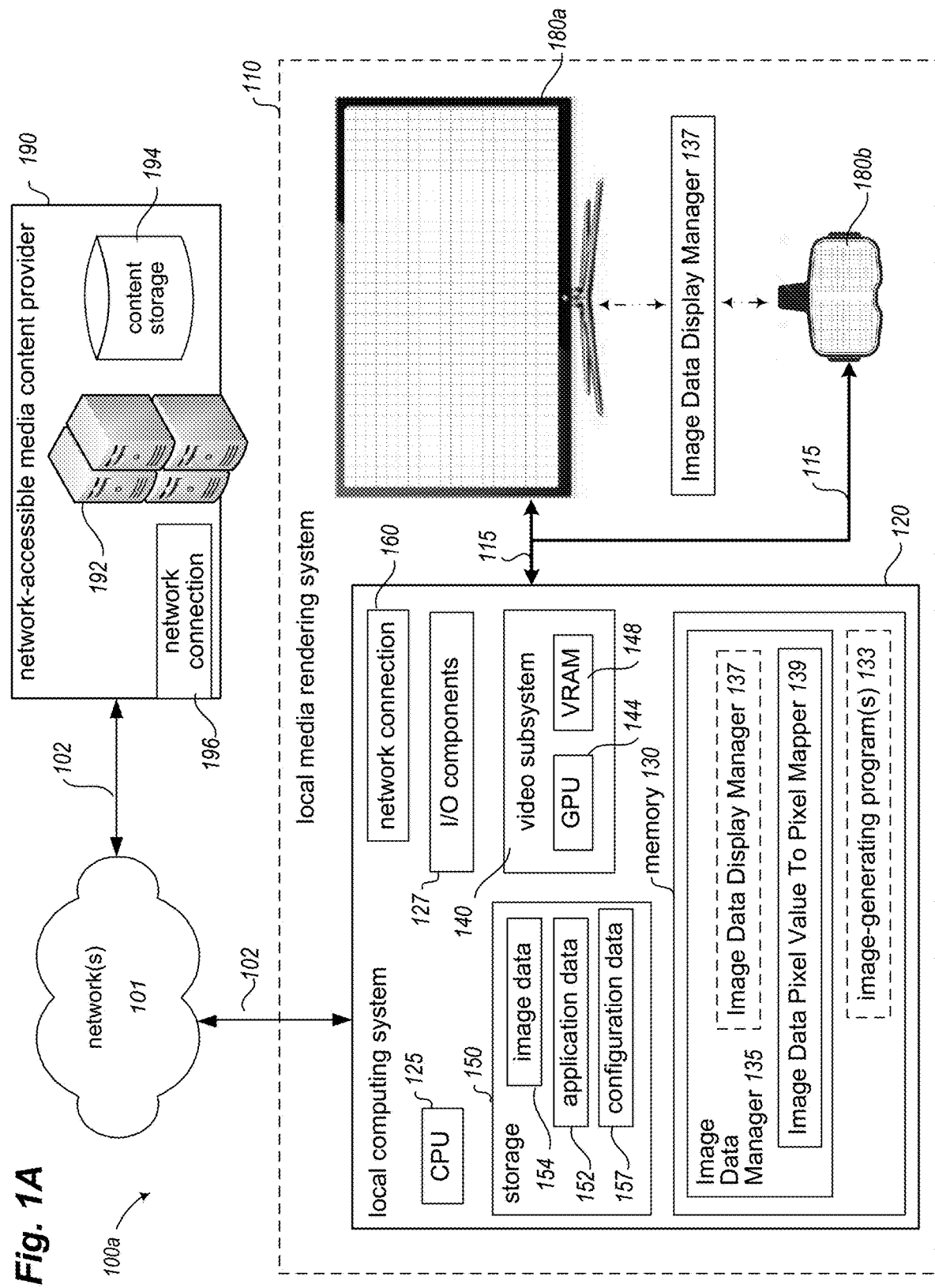
FIG. 1A is a schematic diagram of a networked environment that includes one or more systems suitable for performing at least some techniques described in the present disclosure, including an embodiment of an Image Data Manager ("IDM") system.

The present disclosure relates generally to techniques for controlling display of image data on a display panel based at least in part on mapping of pixel values to pixels, such as for use with frames of video data and/or other images, and in some embodiments for use with one or more display panels that are part of a head-mounted display ("HMD") device used for VR and/or AR display techniques—in at least some such embodiments, the techniques include using different quantities of display panel pixels that are mapped to a single image data pixel value in different areas of the display panel. For example, in at least some such embodiments, such techniques may include separating a display panel into multiple regions, with at least one primary region having a highest resolution of displayed image data (e.g., by using a 1-to-1 mapping of image pixel values to display panel pixels, such that each such image pixel value controls the display of one such pixel), and with one or more secondary regions having one or more lower resolutions of displayed image data (e.g., by using a 1-to-M mapping of image pixel values to display panel pixels for each such secondary region, where M is greater than 1, such that each such image pixel value controls the display of M such pixels, and optionally with different M values used for different secondary regions). The image data may further be encoded and optionally decoded in accordance with such a display panel arrangement in at least some such embodiments, such as to encode the image data per the display panel arrangement to reduce its size before transmission to the display panel, and to optionally decode the image data after the transmission to recreate image data with 1-to-1 pixel values-to-pixels throughout, or to instead use the encoded image data to directly control the display of pixels on the display panel without such decoding. The techniques may further be used in at least some embodiments with each display panel of a VR headset and/or other VR or AR display, such as to provide a highest resolution of displayed image data in a center (or other selected portion) of the image shown on the display panel (e.g., to reflect an area of the image and/or display panel of viewer focus, to reflect an area of the image of particular importance or interest, etc.). Some or all of the techniques described herein may be performed via automated operations of embodiments of an Image Data Manager ("IDM") system, as discussed in greater detail below.

For example, video frame data that includes pixel value information for an associated video frame is acquired in some embodiments, with the pixel value information including pixel values for each pixel within a plurality of unidimensional pixel array rows and unidimensional pixel array columns of the associated video frame. A spatial partition structure is determined to be used as a display panel arrangement with multiple display regions, such as based on various criteria for encoding the video frame data, including determining respective dimensions and positions for a primary display region of the associated video frame and multiple secondary display regions of the associated video frame, and further including selecting a pixel cluster dimension for each of the multiple secondary display regions. For each of the multiple secondary display regions, contents of the secondary display region are modified by assigning pixel values from each of one or more source unidimensional pixel arrays of the included two or more unidimensional pixel arrays to pixels of one or more destination unidimensional pixel arrays of the secondary display region that are adjacent to the source unidimensional pixel array, such that the secondary display region comprises multiple pixel clusters that each have the selected pixel cluster dimension and a single pixel value. After the encoding is complete, the encoded video frame data may be stored for later display, or forwarded to one or more display devices for presentation.

As noted above, the described techniques may be used in at least some embodiments to control display of image data on a display panel based at least in part on mapping of pixel values to pixels, including to use different quantities of display panel pixels that are mapped to a single image data pixel value in different areas of the display panel. The determination of what mappings to use of a single pixel value to a quantity of one or more display panel pixels that it controls display of may be made in various manners in various embodiments. For example, in some embodiments, the mappings may be static, such that each image may be encoded and/or displayed using the same mappings, while in other embodiments the mappings used may be dynamically varied for different images. As one example, some display panels may be accompanied with an eye tracking or other gaze tracking system (e.g., as part of a VR and/or AR system) able to identify an area of a display panel and/or displayed image on which the viewer is currently focused, and if so the mappings used may be dynamically adjusted so that the identified area is determined to be a primary display region using a mapping corresponding to a highest image resolution, while one or more other areas of the display panel may be determined to be secondary display regions using one or more other mappings corresponding to lower image resolution—in such embodiments, the mappings may be dynamically modified at various times (e.g., for every image displayed, when the viewer's area of focus changes by at least a threshold amount, after every X images where X may be larger than one, when one or more other criteria are satisfied, etc.). In addition, in some embodiments a software program or other system that is generating or otherwise providing an image for display may identify one or more areas of the image to be primary display areas that are determined by the IDM system to have a mapping corresponding to a highest image resolution (e.g., a mapping or resolution indicating by the software program or other system that is generating or otherwise providing the image, a mapping or resolution selected by the IDM system to correspond to such primary display areas, a mapping or resolution specified or influenced by a viewer's settings or other actions or preferences, etc.) and may optionally further identify one or more other areas of the image as secondary display areas that are determined by the IDM system to have one or more other mappings corresponding to lower image resolution. Furthermore, in some embodiments a viewer or other user may provide various input used by the IDM system, such as one or more of the following: to identify one or more primary display regions of a display panel for which the IDM system will provide a highest resolution using a corresponding mapping and the other described techniques; to identify one or more primary display areas of an image for which the IDM system will provide a highest resolution using a corresponding mapping and the other described techniques; to identify a mapping and/or resolution to use for one or more primary display panel regions/image areas and/or for one or more secondary display panel regions/image areas; etc. In other embodiments, different displayed image resolutions in different portions of a display panel may be achieved in other manners, including by constructing a display panel with different size pixels in different areas of the display panel (e.g., a display panel with pixels in the corner that are four times the size of pixels in the center, such that a pixel in the corner has only a single corresponding pixel value used to control its display, but creating a visual effect similar to using a 1-to-4 mapping in which a single pixel value is used to control the display of 4 pixels in the corner that are of a uniform size throughout the display panel). Additional details are included below related to controlling display of image data on a display panel based at least in part on mapping of pixel values to pixels.

Benefits in at least some embodiments of the described techniques include addressing and mitigating increased media transmission bandwidths for image encoding by reducing image data size, improving speed of controlling display panel pixels (e.g., based at least in part on corresponding reduced image data size), improving foveated image systems and other techniques that reflect subsets of display panels and/or images of particular interest, etc. Foveated image encoding systems take advantage of particular aspects of the human visual system (which may provide detailed information only at and around a point of focus), but may be computationally intensive (e.g., using much greater computing capacity to process higher resolution video and image data in order to reduce corresponding bandwidths for transmitting that video and image data). In cases of certain VR and AR displays, both the bandwidth and computing usage for processing high resolution media are exacerbated because a particular display device involves two separate display panels (i.e., one for each eye) with two separately addressable pixel arrays, each involving an appropriate resolution. Thus, the described techniques may be used, for example, for decreasing the transmission bandwidth for local and/or remote display of a video frame or other image, while preserving resolution and detail in a viewer's "area of interest" within an image while minimizing computing usage for processing such image data. Furthermore, the use of lenses in head-mounted display devices and with other displays may provide a greater focus or resolution on a subset of the display panel, such that using such techniques to display lower-resolution information in other portions of the display panel may further provide benefits when using such techniques in such embodiments.

For illustrative purposes, some embodiments are described below in which specific types of information are acquired and used in specific types of ways for specific types of structures and by using specific types of devices. However, it will be understood that such described techniques may be used in other manners in other embodiments, and that the invention is thus not limited to the exemplary details provided. As one non-exclusive example, various of the embodiments discussed herein include the use of images that are video frames—however, while many examples described herein refer to a "video frame" for convenience, it will be appreciated that the techniques described with reference to such examples may be employed with respect to one or more images of various types, including non-exclusive examples of multiple video frames in succession (e.g., at 30 or 60 or 90 or some other quantity of frames per second), other video content, photographs, computer-generated graphical content, other articles of visual media, or some combination thereof. As another non-exclusive example, while some illustrated embodiments discuss an implementation of an embodiment of the described techniques that uses particular display rows and/or columns (e.g., one dimensional arrays) in particular manners, such as to copy pixel values in such a row and/or column in a particular secondary display region to one or more other adjacent or otherwise nearby rows and/or columns, other embodiments may implement the use of pixel values in 1-to-M mappings in other manners. As another non-exclusive example, while some illustrated embodiments discuss using a 1-to-1 mapping for a primary display region and a 1-to-M mapping for a secondary display region, other mappings or techniques for duplicated pixel values may be used in other embodiments (e.g., a 1-to-N mapping for a primary display region, where N is 1 or more; a J-to-K mapping for a primary or secondary display region, where J and K are different and K is greater than or lesser than J, etc.). In addition, various details are provided in the drawings and text for exemplary purposes, but are not intended to limit the scope of the invention.

As one example, in certain embodiments a video frame with a uniform display resolution across an array of pixel values may be modified such that the video frame is partitioned into a primary display region (typically located towards the center of the video frame) and multiple secondary display regions (typically placed towards the edges of the video frame). As at least part of processing the video frame data for display by one or more display panels, data density associated with that video frame data is reduced by selectively assigning pixel values from one column or row (a "unidimensional pixel array") within each secondary display region to adjacent or otherwise nearby pixels of a neighboring column or row, so that separate pixel values for the adjacent or otherwise nearby pixels are not included in the encoded reduced data. Effectively, adjacent columns and/or rows of these secondary display regions are duplicated in order to reduce the overall data density of a video frame prior to transmitting data corresponding to that video frame (e.g., over one or more computer networks, such as with respect to Internet video streaming; over a local bus or cable or other transmission path, such as in a wired or wireless connection between a video processing device and a display device). It will be appreciated that selecting a single representative pixel value to encode and use from multiple original pixel values may be performed in various manners in various embodiments, including via down sampling or averaging, sub-sampling or picking a single one of the 4 values, etc. Furthermore, in at least some embodiments, a degree of compression (e.g., a quantity of multiple original pixel values and/or decoded pixel values to be displayed using a single encoded representative pixel value) may be varied in manners other than the regions of the display panel and image, such as to perform color-specific variations in the amount of compression (e.g., for the green color channel, to use less compression than the red or blue color channels), and/or to vary the dynamic range component in a color-specific manner. By selectively reducing the quantity of unique pixel values in a video frame in this manner, substantial bandwidth transmission savings may be provided. For example, exemplary scenarios utilizing these techniques for video processing may result in reducing transmission bandwidth from 67.1 Gb/second to 29.4 Gb/second, a bandwidth reduction of approximately 44%.

In certain embodiments, a system or device tasked with encoding video frame data or other image data for display may spatially partition the corresponding video frame into various structural arrangements of primary and secondary display areas corresponding to associated primary and secondary display regions of a display panel on which the video frame data will be displayed. As one non-limiting example, in one embodiment the system may designate a central area of similar but smaller proportions as the video frame itself as a primary display region at or near the geometric center of the video frame, with portions of the video frame to each side of the primary display region being designated as secondary display regions in which pixel values for each column are duplicated to an adjacent column, and with portions of the video frame above and below the primary display region being designated as secondary display regions in which pixel values for each row are duplicated to an adjacent row. In other embodiments, a primary display region may be positioned within the larger display pixel array in an asymmetric manner for purposes of encoding video frame or other data, such as if it is determined that the likely focal point of a viewer of the corresponding video frame will be some distance away from the geometric center of the display pixel array. The one or more hardware processors or other configured hardware circuitry of such a system or device may include, for example, one or more GPUs ("graphical processing units") and/or CPUs ("central processing units"), such as with the hardware processor(s) being part of an HMD device or other device that incorporates one or more display panels on which the image data will be displayed and/or being part of a computing system that generates or otherwise prepares the image data to be sent to the display panel(s) for display, as discussed further below. More generally, such a hardware processor or other configured hardware circuitry may include, but is not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), digital signal processors (DSPs), programmable logic controllers (PLCs), etc. Additional details and exemplary arrangements of primary and secondary display regions are also provided elsewhere herein, including with respect to FIGS. 2A-2C below.

In various embodiments, the determination of a particular display partitioning arrangement for encoding pixel-based data in the described manner may be made in accordance with one or more criteria. Non-limiting examples of such criteria may include data transmission bandwidth limitations, such as to designate a smaller portion of the corresponding video frame as a primary display region if less data transmission bandwidth is available; data transmission bandwidth objectives, such as to utilize greater pixel cluster dimensions if the use of less data transmission bandwidth for transmitting such video frame data is preferred; graphical computing capacity limitations or objectives, such as to partition the data to be encoded using a greater quantity of smaller secondary display regions in order to achieve higher perceived content quality; media type (e.g., whether the content to be encoded has previously been encoded in another manner that may affect transmission bandwidth, such as via lossless or lossy compression); media content (e.g., based on a predicted or otherwise expected focal point of the viewer, based on an analysis of sets of video frame data within the content to be encoded, based on one or more tags or metadata included in the content to be encoded, etc.); an indicated type of destination display device; graphical limitations and objectives (e.g., a target video frame resolution or target frame rate); visual tracking information (such as based on one or more indications of user eye or gaze position and focus); one or more predefined user preferences; one or more predefined partition structures, such as if a single standardized partition structure or finite subset of such standardized partition structures are to be used for all media content encoded in the described manner; configuration information; and other appropriate criteria.

As used herein, a "pixel" refers to the smallest addressable image element of a display that may be activated to provide all possible color values for that display. In many cases, a pixel includes individual respective sub-elements (in some cases as separate "sub-pixels") for separately producing red, green, and blue light for perception by a human viewer. A pixel "value" as used herein refers to a data value corresponding to respective levels of stimulation for one or more of those respective RGB elements of a single pixel. It will be appreciated that as used herein, the term "adjacent" may designate pixels or arrays of pixels that are either directly adjacent to or simply contiguous with a subject pixel. For example, assigning values from a first of three pixels to the other two pixels may be described as assigning such values from the first pixel to two "adjacent" pixels, even though the third pixel is separated from the first pixel by the intervening second pixel.

FIG. 1A is a schematic diagram of a networked environment 100a that includes a local media rendering (LMR) system 110 (e.g., a gaming system), which includes a local computing system 120 and display devices 180a and/or 180b suitable for performing at least some techniques described herein. The LMR system 110 is, in the depicted embodiment, communicatively connected via one or more computer networks 101 and network links 102 to an exemplary network-accessible media content provider 190 that may further provide content to the LMR system 110 for display and may employ one or more such techniques in some embodiments. In various embodiments, the local computing system 120 may include (as non-limiting examples) a general purpose computing system; a gaming console; a video stream processing device; a mobile computing device (e.g., a cellular telephone, PDA, or other mobile device); a VR or AR processing device; or other computing system. In certain embodiments, the local computing system 120 may provide functionality associated with one, multiple, or all of these. In the depicted embodiment of FIG. 1A, the local media rendering system 110 includes one or more display devices 180 that are communicatively connected to the local computing system 120 via transmission links 115 (which may be wired, such as via one or more cables, or wireless). The display devices include a panel display device 180a and/or a head-mounted display ("HMD") device 180b, each of which includes one or more addressable pixel arrays that are graphically depicted within FIG. 1A in a manner intended for clarity rather than accuracy of scale (each pixel of a typical pixel-based display is, for example, commonly measured in micrometers).

In the illustrated embodiment, the local computing system 120 has components that include one or more general hardware processors (e.g., centralized processing unit, or "CPU") 125; memory 130; various I/O ("input/output") hardware components 127 (e.g., a keyboard, a mouse, one or more gaming controllers, speakers, microphone, IR transmitter and/or receiver, etc.); a video subsystem 140 that includes one or more specialized hardware processors (e.g., graphics processing units, or "GPUs") 144 and video memory (VRAM) 148; computer-readable storage 150; and a network connection 160. Also in the illustrated embodiment, an embodiment of an IDM (Image Data Manager) system 135 executes in memory 130 in order to perform at least some of the described techniques, such as by using the CPU(s) 125 and/or GPU(s) 144 to perform automated operations that implement those described techniques. The illustrated embodiment of the IDM system 135 includes an Image Data Pixel-Value-To-Pixel Mapper component 139 that performs automated operations to encode and transmit image data, and the memory 130 may optionally further execute an Image Data Display Manager component 137 of the IDM system 135 and/or one or more other programs 133 (e.g., to generate video or other images to be displayed on the display device(s) 180. In other embodiments, the Image Data Display Manager component 137 is instead implemented in whole or in part on a display device that includes one or more display panels on which the display will occur, such as to use configured hardware circuitry of the HMD device 180b or other display device 180a to perform automated operations to decode and display image data. As part of the automated operations to implement at least some techniques described herein, the IDM system 135 and/or other image-generating program(s) 133 executing in memory 130 may store and/or retrieve various types of data, including in the example database data structures of storage 150. In this example, the data used may include various types of image data information in database ("DB") 154, various types of application data in DB 152, various types of configuration data in DB 157, and may include additional information, such as system data or other information.

Also in the illustrated embodiment of FIG. 1A, the network-accessible media content provider 190 includes one or more server computing systems 192, content storage 194, and one or more network connections 196. The illustrated server computing systems 192 may each have components similar to those of local computing system 120, including one or more hardware processors, I/O components, local storage devices and memory, although some details are not illustrated for the server computing systems for the sake of brevity.

As one example involving operations performed locally by the local media rendering system, assume that local computing system 120 is a gaming computing system, such that application data 152 includes one or more gaming applications executed via CPU 125 using memory 130, and that various video frame display data is generated and/or processed by the IDM system 135, such as in conjunction with GPU 144 of the video subsystem 140. In order to provide a quality gaming experience, a high volume of video frame data (corresponding to high image resolution for each video frame, as well as a high "frame rate" of approximately 60-180 of such video frames per second) is generated by the local computing system and provided via transmission links 115 to one or more of the display devices 180.

It will be appreciated that, while the display devices 180a and/or 180b are depicted as being distinct and separate from the local computing system 120 in the illustrated embodiment of FIG. 1A, in certain embodiments some or all components of the local computing system may be integrated and/or housed within a single device, such as a mobile gaming device, portable VR entertainment system, etc. In such embodiments, transmission links 115 may, for example, comprise one or more system bus and/or video bus architectures. In addition, at least some of the described techniques may be performed in some embodiments on the display devices 180a and/or 180b, such as to decode image data that is received in encoded form over the connection(s) 115 from the local computing system 120—FIG. 1B illustrates one example of hardware circuitry to perform such image decoding techniques, such as for HMD device 180b, as discussed further below.

It will also be appreciated that computing systems 120 and 190 are merely illustrative and are not intended to limit the scope of the present invention. The computing systems may instead each include multiple interacting computing systems or devices, and the computing systems may be connected to other devices that are not illustrated, including through one or more networks such as the Internet, via the Web, or via private networks (e.g., mobile communication networks, etc.). More generally, a computing system or other computing node may comprise any combination of hardware or software that may interact and perform the described types of functionality, including, without limitation, desktop or other computers, game systems, database servers, network storage devices and other network devices, PDAs, cell phones, wireless phones, pagers, electronic organizers, Internet appliances, television-based systems (e.g., using set-top boxes and/or personal/digital video recorders), and various other consumer products that include appropriate communication capabilities. In addition, the functionality provided by the system 135 may in some embodiments be distributed in one or more components, as described elsewhere herein, and in some embodiments some of the functionality of the system 135 may not be provided and/or other additional functionality may be available. It will also be appreciated that, while various items are illustrated as being stored in memory or on storage while being used, these items or portions of them may be transferred between memory and other storage devices for purposes of memory management and data integrity. Thus, in some embodiments, some or all of the described techniques may be performed by hardware means that include one or more processors or other configured hardware circuitry and/or memory and/or storage, such as when configured by one or more software programs (e.g., by the system 135 and/or it components) and/or data structures, such as by execution of software instructions of the one or more software programs and/or by storage of such software instructions and/or data structures. Some or all of the components, systems and data structures may also be stored (e.g., as software instructions or structured data) on a non-transitory computer-readable storage medium, such as a hard disk or flash drive or other non-volatile storage device, volatile or non-volatile memory (e.g., RAM), a network storage device, or a portable media article to be read by an appropriate drive (e.g., a DVD disk, a CD disk, an optical disk, etc.) or via an appropriate connection. The systems, components and data structures may also in some embodiments be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Figure 1B:
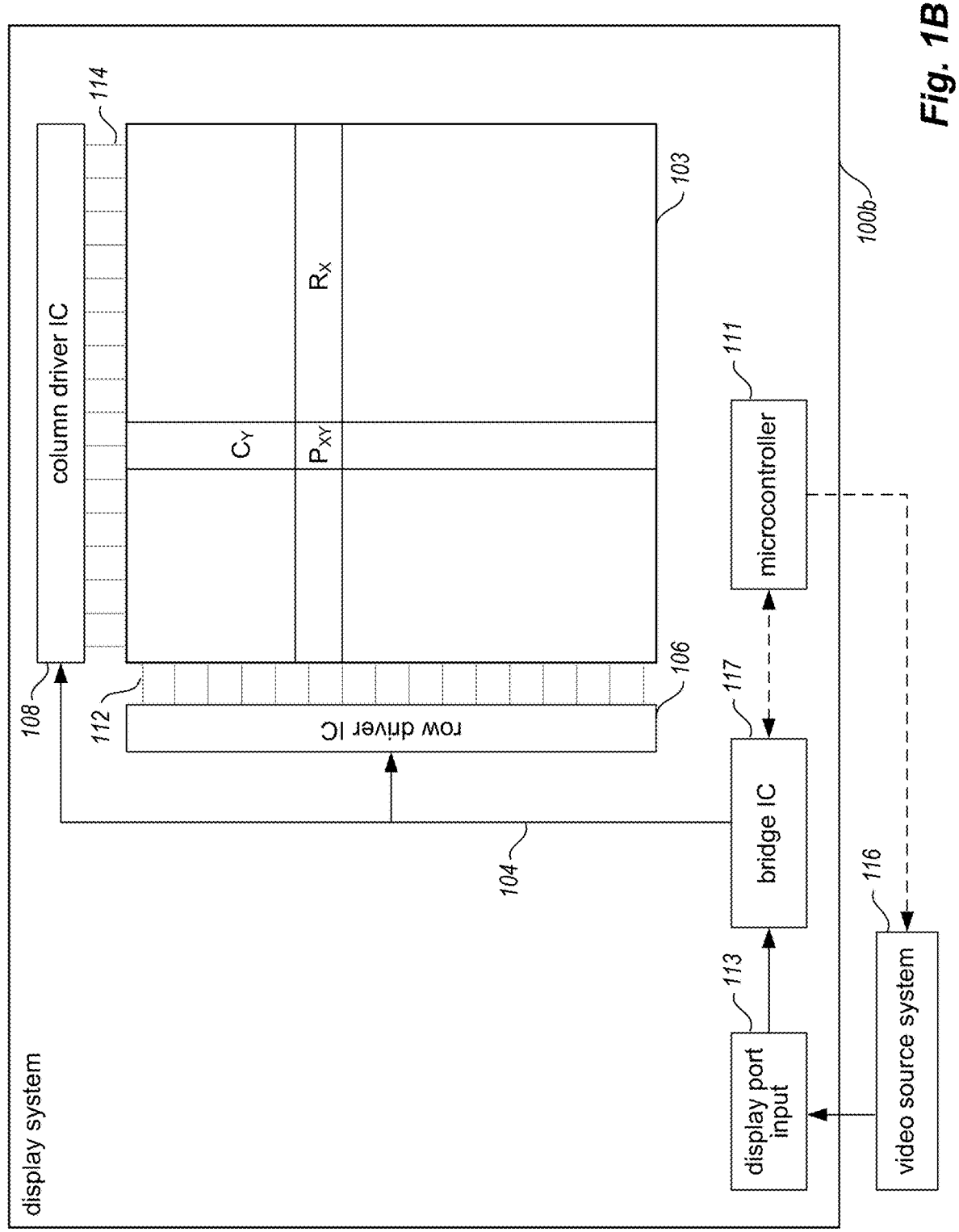
FIG. 1B is a schematic diagram illustrating example configured hardware circuitry of a display device for performing at least some techniques described in the present disclosure.

FIG. 1B illustrates one example of hardware circuitry on a display device, such as HMD device 180*b*, that may be configured to perform automated operations to decode image data that is received in encoded form and to initiate the display of the image data on one or more display panels in accordance with the described techniques. In particular, FIG. 1B includes an example display system 100*b* that has a pixel array 103 in which a plurality of pixels P are arranged in rows R and columns C. Although only one example row (labeled $R_x$) and one example column (labeled $c_y$) are shown, and one example pixel (labeled $P_{xy}$) at their intersection is shown, in practice the pixel array 103 may be any M×N array, where M is the number of rows and N is the number of columns in the pixel array. The display system 100*b* may be an LCD system or an OLED system, for example. In implementations where the display system 100*b* is a color display, the pixels P may comprise sub-pixels that each produces a different color (e.g., red, green, blue).

Adjacent the pixel array 103 of the display system 100*b* is a peripheral area which includes hardware circuitry for driving the individual pixels of the pixel array 103, as well as optionally performing other functions. In particular, the hardware circuitry include a row driver circuit (e.g., IC, or integrated circuit) 106, also referred to at times as a gate or scan driver circuit, and a column driver circuit (e.g., IC) 108, also referred to at times as a data driver circuit. The row driver circuit 106 and column driver circuit 108 may be collectively referred to herein as a "pixel driver subsystem." Each of the driver circuits 106 and 108 may be formed from one or more integrated circuits, for example. In practice, a display port 113 receives image data input from an external video source system 116 (e.g., the local computing system 120 of FIG. 1A), such as in an encoded form as discussed elsewhere herein, and transmits the received data to a bridge IC 117. The bridge IC 117 is configured to implement logic to perform automated operations to decode the received encoded data as discussed herein, and to forward respective information to the row and column driver circuits to implement the decoded pixel values. In particular, the row driver circuit 106 includes a plurality of row select lines 112, one for each of the rows R of pixels (or sub-pixels) in the pixel array 103, with each of row select lines 112 being electrically coupled to scan electrodes for the pixels in the corresponding row of the pixel array 103. The column driver circuit 108 similarly includes a plurality of data lines 114, one for each of the columns C of pixels (or sub-pixels) in the pixel array 103, with each of the data lines 114 being electrically coupled to data electrodes for the pixels in the corresponding column of the pixel array 103. The row driver circuit 106, under control of the bridge IC 117, selectively enables one or more rows of the pixel array 103 at a time via the row select lines 112, and the column driver circuit 108, under control of the bridge IC 117, outputs data (e.g., voltage levels) on the data lines 114 for each of the columns of pixels in the pixel array 103. Thus, the intensity of light transmitted by each pixel is determined by a drive voltage applied by the column driver circuit 108 to a pixel's data electrode via a data line 114 when the pixel's scan electrode is pulsed high by the row driver circuit 106 via a row select line 112. In at least some implementations the driver circuits 106 and 108 and/or the bridge IC 117 may be configured to simultaneously load multiple rows with the same data or similar data.

As previously noted, the bridge IC 117 is operatively coupled to a video source system 116 via the display port input 113, which feeds an image stream (e.g., processed video data) to the bridge IC 117 for display on the display system 100*b*. The video source system 116 may be any video output source system that utilizes the display system, such as a flat panel television, laptop, tablet computer, mobile phone, head mounted display, wearable computer, etc. The video source system 116 may be a component (e.g., graphics controller) of a larger system. The bridge IC 117 receives the image stream and converts it to the appropriate voltage programming information to be provided to the pixels in the pixel array 103 to sequentially display images present in the image stream. The bridge IC 117 may include a level shifter, timing, and analog functions generators, for example. Generally, the bridge IC 117 may generate timing and data signals for biasing the row and column driver circuits 106 and 108, by taking as input from the video source system 116 one or more of the image stream signals (e.g., digital signals), synchronization information, timing information, etc.

The display system 100*b* also includes a separate microcontroller 111 in the illustrated example, such as to generate and transmit information back to the video source system 116, although other embodiments may not include such a microcontroller as part of the display system 100*b* (e.g., if one or more such microcontrollers are part of one or more other systems of the display device, or instead are not implemented in a particular embodiment). The transmitted information may include, for example, one or more of the following: location and/or orientation information for the display device (e.g., HMD device 180*b*) on which the display system is implemented; wearer user pupil and/or gaze direction information; etc., although in one embodiments one or more such types of information may be transmitted to the video source system from other hardware circuitry (not shown) on the display device that is separate from the display system 100b. The bridge IC 117 and/or microcontroller 111 may include memory, I/O interfaces, communications systems, etc., as well as one or more processors (e.g., one or more central processing units (CPUs), microprocessors, digital signal processors (DSPs), application-specific integrated circuits (ASICs), field programmable gate arrays (FPGAs), graphics processing units (GPUs), other programmable circuits, combinations of the above, etc.).

In certain embodiments, either as part of generating video frame data for one or more video frames or as part of subsequent processing of such video frame data, the video frame data is encoded to reflect a primary display region and one or more secondary display regions. Such encoding may include, for example, using a 1-to-1 mapping for the primary display region, and further include modifying the content of each secondary display region to reflect a 1-to-multiple mapping for each secondary display region, such as by assigning pixel values from some pixels of the secondary display region to multiple other pixels of that secondary display region—for example, with respect to a particular secondary display region, implementing the 1-to-multiple mapping may include assigning pixel values from a first unidimensional pixel array (i.e., a column or row) within the secondary display region to pixels of one or more neighboring unidimensional pixel arrays (i.e., an adjacent column or adjacent row). In various embodiments, the ratio of such duplicated or "mirrored" pixels to the original "source" pixels within each secondary display region may be characterized by the resulting dimensions of a contiguous pixel cluster within the secondary display region, with all pixels within such a pixel cluster being assigned a single pixel value by the IDM system. In addition, the IDM system may in some embodiments further provide a simulated mapping along a boundary between a primary and secondary display region (e.g., along the inside edges of the 1-to1 primary region)_and/or between two or more secondary display regions, with the simulated mapping using feathering and/or interpolation over a distance of pixels away from the boundary in order to make the border of regions with different mappings less prone to discrete boundary artifacts and therefore less visually perceptible. Furthermore, the IDM system may in some embodiments also pre-process, for different portions of the video frame data corresponding to different display regions, those different portions differently to reflect their subsequent display with varying mappings—for example, in one embodiment, image data intended for different display regions may have different image filtering applied in order to compensate for the varying frequency modulation response curve that those regions may have in different dimensions. The pixel cluster dimension (i.e., the size of M for a 1-to-M mapping) for one or more of the secondary display regions may be selected by the IDM system based on various criteria, with non-limiting examples of such criteria including the following: data transmission bandwidth limitations, such as to utilize greater pixel cluster dimensions if less data transmission bandwidth is available for transmitting such video frame data; data transmission bandwidth objectives, such as to utilize greater pixel cluster dimensions if the use of less data transmission bandwidth for transmitting such video frame data is preferred; graphical computing capacity limitations or objectives; media type (e.g., whether the content to be encoded has previously been encoded in another manner that may affect transmission bandwidth, such as via lossless or lossy compression); media content (e.g., based on a predicted focal point of the viewer, or based on an analysis of sets of video frame data to be encoded); an indicated type of destination display device; graphical limitations and objectives (e.g., a target video frame resolution or target frame rate); visual tracking information (such as based on one or more indications of user eye position and focus); one or more predefined user preferences; configuration information; and other appropriate criteria.

In at least some embodiments, the IDM system may dynamically determine a manner of partitioning a display into primary and secondary display regions) and/or pixel cluster dimensions for encoding pixel-based data, such as for each video frame or other image. For example, such display partitioning may be performed by the IDM system in accordance with a current available transmission bandwidth capacity, which may be greater or less than previous or future available transmission bandwidth capacity (e.g., a computing system encoding a video stream for transmission during "peak" network utilization times may elect to partition video frame data for the video stream using a smaller primary display region than the same computing system encoding the same video stream for transmission during a time of low network utilization). Alternatively, or in conjunction with the smaller primary display region, the encoding computing system may determine to utilize larger pixel cluster dimensions for one or more of the secondary display regions as part of the encoding process.

In one or more embodiments, the IDM system may determine to decode video frame data that has been previously encoded in the manner described above, such as part of initiating display of the video frame data (or other image) on a display device (e.g., display devices 180a and/or 180b). For example, the IDM system may initiate display of such encoded video frame data on a display device by using the 1-to-1 pixel mapping to control display of the primary display region of the video frame data, and using each pixel value of each encoded secondary display region to control display of multiple pixels within that secondary display region (i.e., in accordance with the 1-to-multiple pixel mapping indicated by the selected pixel cluster dimension with which the video frame data was previously encoded).

As another example involving operations performed by both the local media rendering system 110 and the media content provider 190, assume that the local computing system 120 is a video stream processing device for receiving video frame data from the media content provider via computer network(s) 101 and network links 102 (e.g., in response to a request for particular media content that includes the video frame data), and processing and rendering that media content on the display devices 180. In this second example, the media content provider 190 retrieves the requested media content from content storage 194 in response to the request from the local computing system, with the media content being encoded by the media content provider in a manner similar to that discussed above (with respect to at least one primary display region and one or more secondary display regions) before transmission to the local media rendering system (e.g., by an IDM system, not shown, executing in local memory of one or more of the server computing systems 192 of media content provider 190). In certain embodiments, the retrieved media content may have previously been encoded, or it may instead be dynamically encoded at a time of retrieval and transmission—as one example of such an embodiment with previously encoded content, the content storage 194 may contain multiple versions of the requested media content (with each version being encoded in accordance with various encoding schemes), and may select and use one of the versions in response to a particular request based on one or more of various criteria. Non-limiting examples of such criteria may include those described above with respect to selection of a particular pixel cluster dimension for a secondary display region in the first example. In this example, the media content provider 190 transmits the selected and encoded version of the requested media content to the local media rendering system 110 via network(s) 101 and network links 102. Once the encoded version of the requested media content is either partially or completely received by the local media rendering system, IDM system 135 initiates decoding of the received media content and display of the decoded media content via one or more display devices 180 in the manner described above, using a 1-to-1 pixel mapping to control display of the primary display region of the video frame data, and using each pixel value of each encoded secondary display region to control display of multiple pixels within that secondary display region (i.e., in accordance with the 1-to-multiple pixel mapping indicated by the selected pixel cluster dimension with which the video frame data was previously encoded by the media content provider 190.)

Figure 2A:
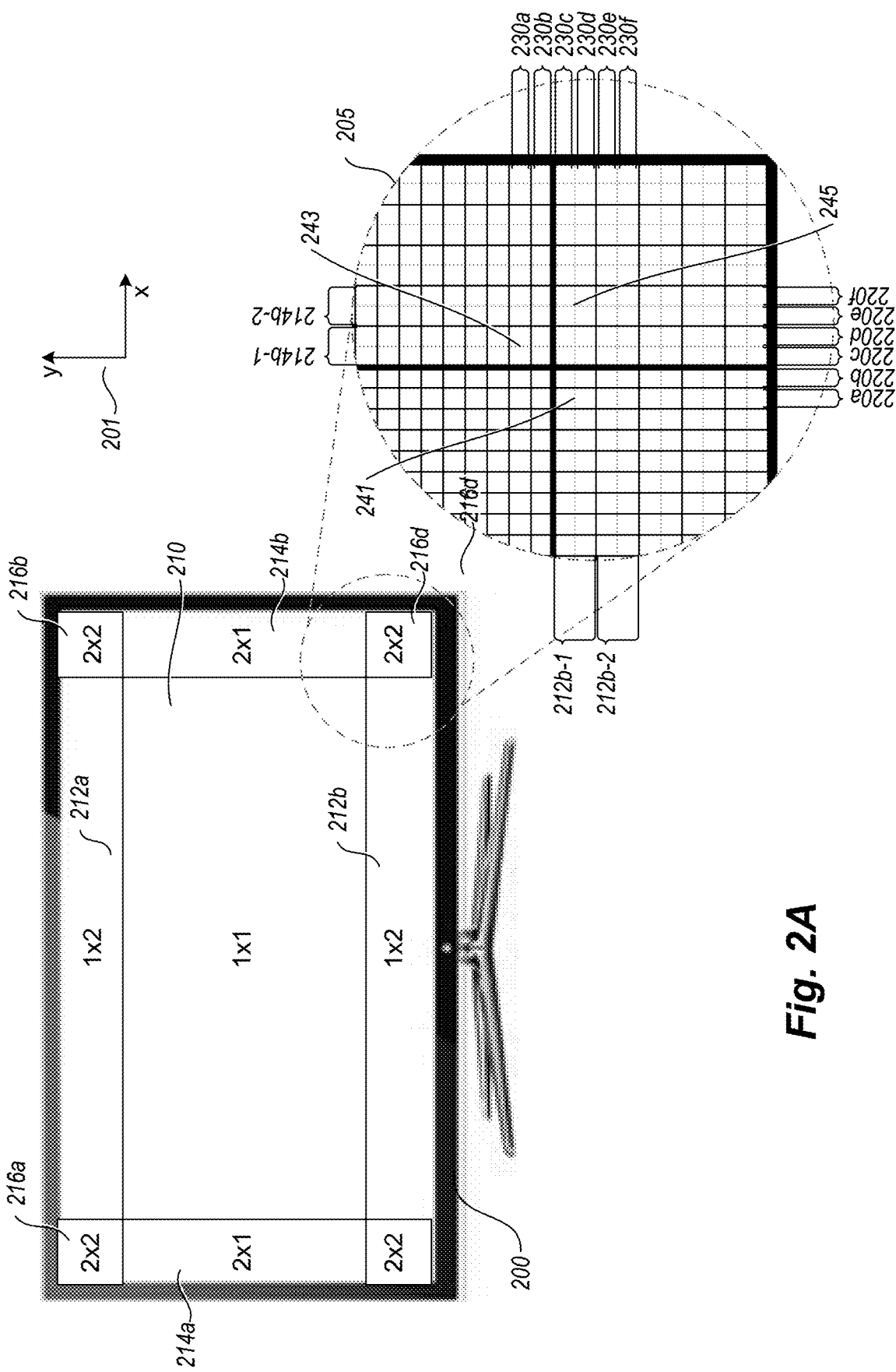
FIGS. 2A-2C illustrate examples of encoding and decoding image data for display by an embodiment of an IDM system in accordance with techniques described herein.

FIG. 2A illustrates a result of encoding video frame data for display in accordance with one embodiment of techniques described herein. In particular, FIG. 2A depicts use of the techniques with a flat-panel console display device 200, but similar techniques may instead be used with one or more display panels of a head-mounted display device 295 as illustrated further with respect to FIGS. 2B and 2C—in this example, the display device 200 includes a pixel array that has been partitioned for purposes of encoding such video frame data into a primary display region 210 and secondary display regions 212 (including regions 212a and 212b), 214 (including regions 214a and 214b) and 216 (including regions 216a, 216b, 216c and 216d). Secondary display regions 212a and 212b are respectively located between the primary display region and the top and bottom edges of the pixel array. Secondary display regions 214a and 214b are respectively located between the primary display region and the left and right edges of the pixel array. Secondary display regions 216a-d are respectively located in the corners of the pixel array and delineate the four junctions of the secondary display regions 212 and 214.

Figure 2B:
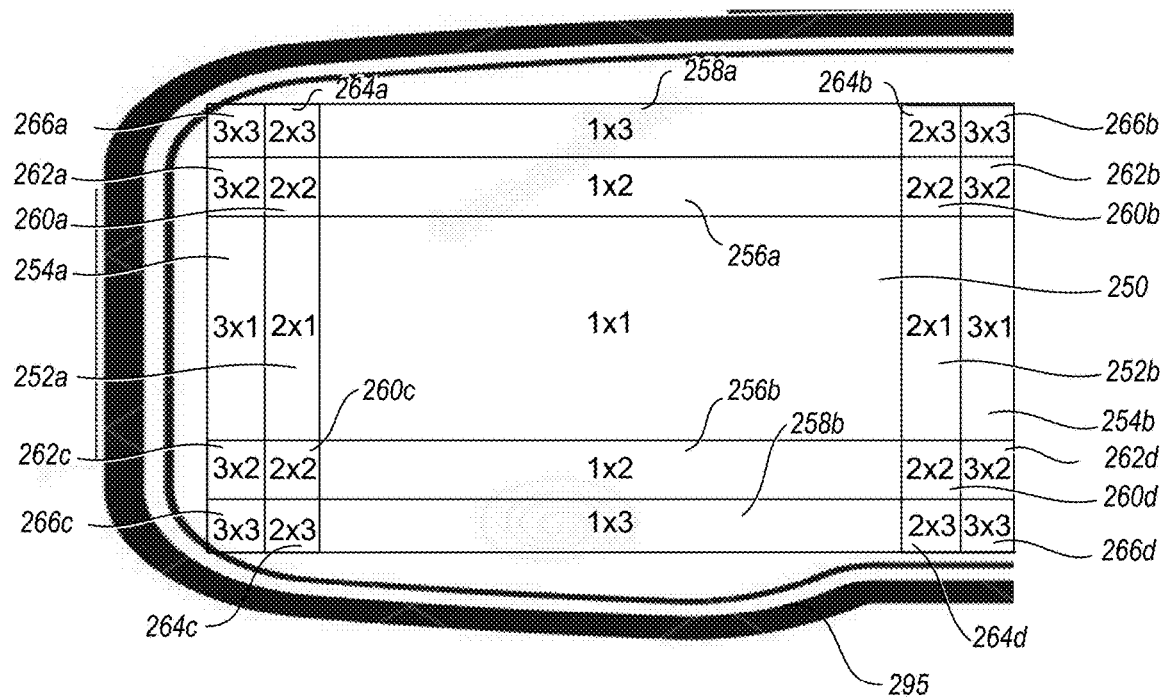
Figure 2C:
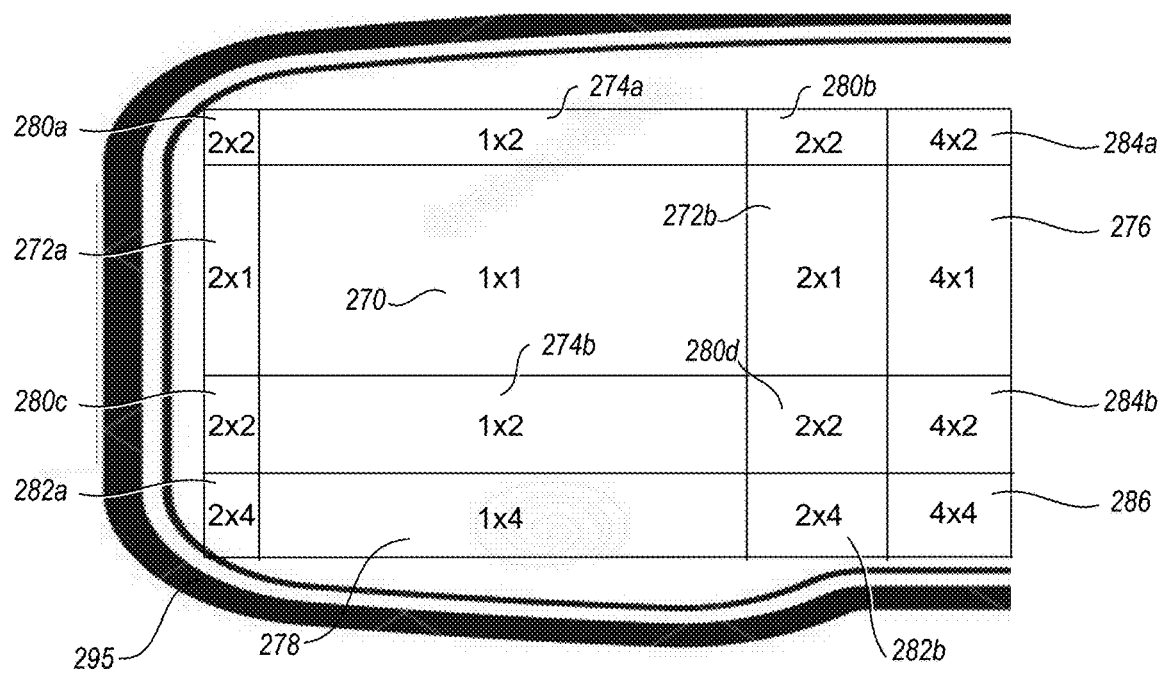

In the illustrated embodiments of FIGS. 2A-C, each partitioned display region is labeled with indicated dimensions (in pixels, and with horizontal x and vertical y orientation depicted by directional indicator 201) of pixel clusters that share identical pixel values as a result of the encoding operation performed on the unidimensional pixel arrays within that display region. For example, in a display region having an indicated pixel-dimension of "1×1", the original resolution and pixel values of the display region are preserved during encoding in a 1-to-1 mapping; in a display region having an indicated pixel-dimension of "2×2", the encoding process results in pixel clusters of 2 pixels (horizontally) by 2 pixels (vertically) that are assigned identical pixel values from a single source pixel value, corresponding to a 1-to-4 mapping (with a single source pixel value and 3 duplicated pixel values) and giving a pixel cluster size of 4 pixels; and in a display region having an indicated pixel-dimension of "2×3" (not shown), the encoding process results in pixel clusters of 2 pixels (horizontally) by 3 pixels (vertically) that are assigned identical pixel values, giving a pixel cluster size of 6 pixels.

Again with reference to the specific embodiment of FIG. 2A, primary display region 210 includes pixel value information corresponding to full "1×1" resolution, indicating a 1-to-1 pixel mapping in which no pixels are assigned pixel values from neighboring pixels within the primary display region—thus, if the size of primary display region 210 were 1000 pixels by 800 pixels, for example, the encoded data for the region 210 would include data for 800,000 pixel values. In this depicted embodiment, secondary display regions 212a and 212b are identified in the illustrated embodiment as having pixel clusters indicating a 1-to-2 mapping (i.e., pixel cluster dimension of 2) structured in a "1×2" manner with 1 horizontal pixel to 2 vertical pixels. For example, as indicated in expanded view 205, the secondary display region of 212b includes unidimensional pixel arrays (rows) 230c and 230d. Assume that prior to encoding of the video frame, each of rows 230c and 230d has a unique set of pixel values. As part of encoding the video frame, the pixel values of pixels within row 230c of region 212b are assigned (such as based on criteria described elsewhere herein in greater detail) to corresponding pixels within adjacent row 230d. As a result, pixel cluster 241, having dimensions of 1 horizontal pixel by 2 vertical pixels, encompasses the two formerly distinct pixels located respectively at the intersection of column 220a with row 230c and column 220a with row 230d; similarly, rows 230c and 230d of column 220b form an additional pixel cluster that uses a single pixel value (e.g., the original pixel value for row 230c and column 220b). In this manner, the set of unique pixel values in row 230c for region 212b prior to the encoding process are extended or "mirrored" to form new expanded row 212b-1 in region 212b; the set of unique pixel values in row 230e for region 212b prior to the encoding process are similarly mirrored to form new expanded row 212b-2 in region 212b; and so on for the entirety of secondary display region 212b. As a result, the effective resolution of (and transmission bandwidth for) the portion of frame data corresponding to secondary display region 212b is reduced by half. Operations to encode the frame data corresponding to the pixels of secondary display region 212a are performed in a similar manner.

In a similar manner, consider secondary display region 214b, which is identified in the illustrated embodiment as having a pixel cluster with a 1-to-2 mapping (i.e., pixel cluster dimension of 2) structured in a "2×1" manner with 2 horizontal pixels to 1 vertical pixel, and includes unidimensional pixel arrays (columns) 220c, 220d, 220e, and 220f. Again assume that prior to encoding, each such column has a unique set of pixel values. As part of encoding the video frame, the pixel values of pixels within column 220c are assigned to corresponding pixels within adjacent column 220d. As a result, pixel cluster 243, having dimensions of 2 horizontal pixels by 1 vertical pixel, encompasses the two formerly distinct pixels located respectively at the intersection of row 230a with column 220c and row 230a with column 220d. In this manner, the set of unique pixel values in column 220c for region 214b prior to the encoding process are mirrored to column 220d to form new expanded column 214b-1; the set of unique pixel values in column 220e for region 214b prior to the encoding process are mirrored to column 220f to form new expanded column 214b-2; and so on for the entirety of secondary display region 214b. Thus, in a manner similar to that described above with respect to secondary display region 212b, the effective resolution of (and transmission bandwidth for) the portion of frame data corresponding to secondary display region 214b is reduced by half. Encoding of the frame data is similarly performed for secondary display region 214a.

In the depicted embodiment of FIG. 2A, the encoding process for video frame data corresponding to secondary display regions 216a-216d is performed in a manner similar to that for secondary display regions 212a-212b and 214a-214b. In particular, and with reference to secondary display region 216d as depicted in extended view 205, each unidimensional pixel array of the secondary display region 216d is assumed to include a set of unique pixel values prior to encoding. As part of the encoding of the video frame data, pixel values for a first unidimensional pixel array, such as those of the portion of row 230c within that secondary display region 216d, are assigned to corresponding pixels of the portion of adjacent row 230d within that secondary display region. Similarly, pixel values for the unidimensional pixel array in the portion of column 220e for region 216d are assigned to corresponding pixels of the portion of adjacent column 220f. The resulting pixel cluster 245 has the dimension size of "2×2" indicated for the secondary display region 216d, in which all four pixels share the pixel value previously indicated within the unencoded frame data for the unique pixel located at the intersection of row 230c and column 220e. While the four pixels within the pixel cluster are set in this example by first doubling the row values as indicated and then doubling the column values as indicated, the four values may be set in other manners (e.g., in a single operation) in other embodiments.

It will be appreciated that the 1-to-multiple pixel mapping used for the secondary display regions in this example reflects a duplicated row and/or duplicated column approach, other arrangements and configurations of pixel cluster dimensions and 1-to-multiple pixel mappings may be used by the IDM system in various circumstances and embodiments, and that many variations of the encoding scheme described above with respect to specific pixel value assignments and pixel value mappings may be utilized without departing from the scope of the described techniques. As one example, the selection of a first unidimensional pixel array, from which pixel values are assigned to one or more neighboring and/or adjacent unidimensional pixel arrays, may be made in various manners by the IDM system without substantially affecting the encoding process. For example, in certain embodiments a unidimensional pixel array forming the border of primary display region 210 (such as corresponding to row 230b in FIG. 2A) may be utilized as the "source" of pixel values for the unidimensional pixel array on the edge of an adjacent secondary display region 212 (such as corresponding to row 230c). In certain embodiments, unidimensional pixel arrays may be mirrored in a manner other than that described above, such as in a manner orthogonal to the relative proportions of the secondary display regions in which such unidimensional pixel arrays are located—e.g., assigning pixel values in a manner effectively mirroring columns within secondary display region 212b (such as assigning values from the pixels of column 220a to the pixels of column 220b) rather than rows, and/or assigning pixel values to effectively mirror rows of secondary display region 214b rather than columns (such as assigning values from the pixels of row 230b to the pixels of row 230a).

As another example, and as discussed below with respect to FIGS. 2B and 2C, multiple pixels of a pixel cluster may be assigned values from a single pixel, such as if pixel values from unencoded unidimensional pixel array 230d were assigned to corresponding pixels of unidimensional pixel arrays 230c, 230e, and 230f. In such an example, secondary display regions 212b and 216d would have a duplication structure of 1×4 and 2×4 respectively, with the resulting reduction of necessary transmission bandwidth for the encoded video frame data corresponding to those secondary display regions increasing accordingly.

FIGS. 2B and 2C depict alternative embodiments and arrangements for partitioning a pixel array into primary and secondary display regions, such as embodiments in which the encoding computing system has determined to partition the video frame data in accordance with disparate criteria, or in accordance with identical criteria but in altered circumstances (such as if available transmission bandwidth has changed, specified user preferences altered, or different types of media are to be encoded/decoded). In addition, FIGS. 2B and 2C depict use of the techniques with one of two display panels of a head-mounted display device 295, with half of the device 295 shown—while not illustrated, similar techniques may be used in an additional display panel in the other half (not shown) of the device 295.

In the exemplary embodiment of FIG. 2B, and in a manner similar to that described above with respect to primary display region 210 of FIG. 2A, the IDM system determines to partition a full-resolution primary display region 250 in the approximate geographic center of the larger pixel array of head-mounted display device 295, with a pixel mapping of 1-to-1 and a corresponding cluster structure of 1×1. In notable contrast with the partitioning arrangement depicted in FIG. 2A, the central primary display region of FIG. 2B is surrounded by two distinct layers of secondary display regions, with the outermost layer of secondary display regions assigned a larger pixel mapping and cluster dimension than that for those secondary display regions immediately adjacent to the primary display region 250, as follows. Secondary display regions 252a and 252b are assigned a pixel cluster structure of 2×1 and are respectively positioned adjacent to the left and right borders of the primary display region. Secondary display regions 254a and 254b are assigned a pixel cluster structure of 3×1, with secondary display region 254a being positioned between secondary display region 252a and the leftmost edge of the panel display device, and secondary display region 254b being positioned between secondary display region 252b and the rightmost edge of the panel display device. Secondary display regions 256a and 256b are assigned a pixel cluster structure of 1×2 and are respectively positioned adjacent to the top and bottom borders of the primary display region. Secondary display regions 258a and 258b are assigned a pixel cluster structure of 1×3, with secondary display region 258a being positioned between secondary display region 256a and the topmost edge of the panel display device, and secondary display region 258b being positioned between secondary display region 256b and the bottom edge of the panel display device. Secondary display regions 260a-d are assigned a pixel cluster structure of 2×2 and are respectively positioned at the junctions of secondary display regions 256a and 252a, 256a and 252b, 252a and 256b, and 252b and 256b. Secondary display regions 262a-d are assigned a pixel cluster structure of 3×2, and are respectively positioned at the junctions of secondary display regions 256a and 254a, 256a and 254b, 256b and 254a, and 256b and 254b. Secondary display regions 264a-d are assigned a pixel cluster structure of 2×3, and are respectively positioned at the junctions of secondary display regions 258a and 252a, 258a and 252b, 258b and 252a, and 258b and 252b. Secondary display regions 266a-d are assigned a pixel cluster structure of 3×3, and are respectively positioned at the junctions of secondary display regions 258a and 254a, 258a and 254b, 258b and 254a, and 258b and 254b.

In a manner similar to that described with respect to the encoding of frame data in the embodiment of FIG. 2A, the video frame data corresponding to each of the multiple secondary display regions is modified by assigning pixel values from a first pixel (and specifically in this example, one or more first unidimensional pixel arrays) within the secondary display region to one or more second pixels (again, in this example to one or more second unidimensional pixel arrays) within the secondary display region. For example, in the depicted embodiment, pixel values from a source row within secondary display region 256b are assigned to corresponding pixels of an adjacent row within that secondary display region (resulting in the indicated pixel cluster dimension of 1×2 for the secondary display region 256b); pixel values from a source row within secondary display region 258b are assigned to corresponding pixels of two adjacent rows within that secondary display region (resulting in the indicated pixel cluster dimension of 1×3 for the secondary display region 258b). Similarly, pixel values from a source column within secondary display region 252b are assigned to corresponding pixels of a column adjacent to that source column within that secondary display region (resulting in the indicated pixel cluster dimension of 2×1 for the secondary display region 252b); pixel values from a source column within secondary display region 254b are assigned to corresponding pixels of two columns adjacent to that source column within that secondary display region (resulting in the indicated pixel cluster dimension of 3×1 for the secondary display region 254b). Secondary display regions 260a-d, 262a-d, 264a-d and 266a-d are handled in a manner analogous to that of secondary display regions 216a-d of FIG. 2A.

In the exemplary embodiment of FIG. 2C, and in a contrasting manner with respect to that described above for FIGS. 2A and 2B, the encoding computing system determines to partition video frame data in an asymmetric configuration. As described elsewhere herein, such partitioning determination may be made based on various criteria, and in some cases may reflect a dynamic determination to encode a first video frame or other image for the display panel of the HMD device 295 in the manner shown in FIG. 2B, and a dynamic determination to encode a later video frame or other image (e.g., a next video frame or other image) for the display panel of the HMD device 295 in the manner shown in FIG. 2C—thus, in such embodiments, the position (e.g., location and/or size) of the primary display region and/or secondary display region may change for different images. However, in embodiments in which the sizes of the display regions are maintained (while the locations optionally change), the size of the encoded images (e.g., the amount of data in the encoded images) and the corresponding transmission rate may be maintained in a constant manner. For example, the determination in FIG. 2C to position the primary display region 270 with the highest resolution in a location away from a geographic center of the display panel of the head-mounted display device 295 may be based on eye-tracking or gaze-tracking data, such as if a focal point of the human viewer's attention is being monitored by one or more devices communicatively coupled to the encoding computing system. Alternatively, the determination in FIG. 2C to position the primary display region 270 with the highest resolution in a location away from a geographic center of the display panel may be based on content of the media being encoded (such as if action depicted by a video sequence that includes the video frame data to be encoded is located towards the upper-left of the corresponding video frame, or if a level of detail in the corresponding video frame is significantly higher towards the upper-left corner), or instead on other criteria. Further to this asymmetric arrangement, the primary display region 270 of FIG. 2C is bordered by a single layer of secondary display regions on the top and left sides, but bordered by two layers of secondary display regions on the bottom and right sides.

In this example of FIG. 2C, secondary display regions 272a and 272b are assigned a pixel cluster structure of 2×1, and are respectively positioned adjacent to the left and right sides of the primary display region 270. Secondary display regions 274a and 274b are assigned a pixel cluster structure of 1×2, and are respectively positioned adjacent to the top and bottom sides of the primary display region. Secondary display region 276 is assigned a pixel cluster structure of 4×1, and is positioned between secondary display region 272b and the rightmost edge of the panel display device. Secondary display region 278 is assigned a pixel cluster structure of 1×4, and is positioned between secondary display region 274b and the bottom edge of the panel display device. Secondary display regions 280a-d are assigned a pixel cluster structure of 2×2 and are respectively positioned at the junctions of secondary display regions 274a and 272a, 274a and 272b, 274b and 272a, and 274b and 272b. Secondary display regions 282a-b are assigned a pixel cluster structure of 2×4, and respectively positioned at the junctions of the secondary display region 278 with secondary display regions 272a and 272b. Secondary display regions 284a-b are assigned a pixel cluster structure of 4×2, and respectively positioned at the junctions of the secondary display region 276 with secondary display regions 274a and 274b. Secondary display region 286 is assigned a pixel cluster structure of 4×4, and positioned at the junction of secondary display regions 276 and 278.

In a manner similar to that described with respect to the encoding of frame data in the embodiments of FIGS. 2A and 2B, the video frame data corresponding to each of the multiple secondary display regions is modified by assigning pixel values from each of one or more first unidimensional pixel arrays within the secondary display region to one or more second unidimensional pixel arrays within the secondary display region. For example, pixel values from a source row within secondary display region 274b are assigned to corresponding pixels of a row adjacent to that source row within that secondary display region 274b (resulting in the indicated pixel cluster dimension of 1×2); pixel values from a source row within secondary display region 278 are assigned to corresponding pixels of three rows adjacent to each such source row within that secondary display region 258b (resulting in the indicated pixel cluster dimension of 1×4 for the secondary display region). Similarly, pixel values from a source column within secondary display region 272b are assigned to corresponding pixels of a column adjacent to each such source column within that secondary display region 272b (resulting in the indicated pixel cluster dimension of 2×1); pixel values from a source column within secondary display region 276 are assigned to corresponding pixels of three columns adjacent to each such source column within that secondary display region 276 (resulting in the indicated pixel cluster dimension of 4×1). Other secondary display regions are structured and managed as indicated, and in a manner analogous to that discussed above. As noted elsewhere, it will be appreciated that while the 1-to-multiple pixel mapping described for this example utilizes such mapping with respect to unidimensional pixel arrays of the secondary display regions, in various scenarios and embodiments such mappings may be used in other configurations, such as to map a single pixel value to a pixel cluster having any appropriate pixel cluster dimension.

For clarity and ease of representation herein, the illustrated examples of FIGS. 2A-2C utilize display partitioning arrangements comprised solely of rectangular partitions of the representative video frame. However, it will be appreciated that various alternative partition shapes may be utilized without departing from the intended scope of the presented techniques, such that the destination pixel array is encoded in the manner described above—that is, such that one or more primary display regions having a first resolution are provided, with one or more secondary display regions being encoded to effectively reduce that first resolution within their respective boundaries by assigning pixel values from one or more source pixels to one or more mirrored pixels within each secondary display region. For example, in certain embodiments circular or ellipsoidal primary display regions may be utilized, with the remaining portion of the display pixel array being partitioned into one or more secondary display regions in accordance with a relative distance from the primary display region, from one or more edges of the displayed pixel array, or other manner.

Figure 3:
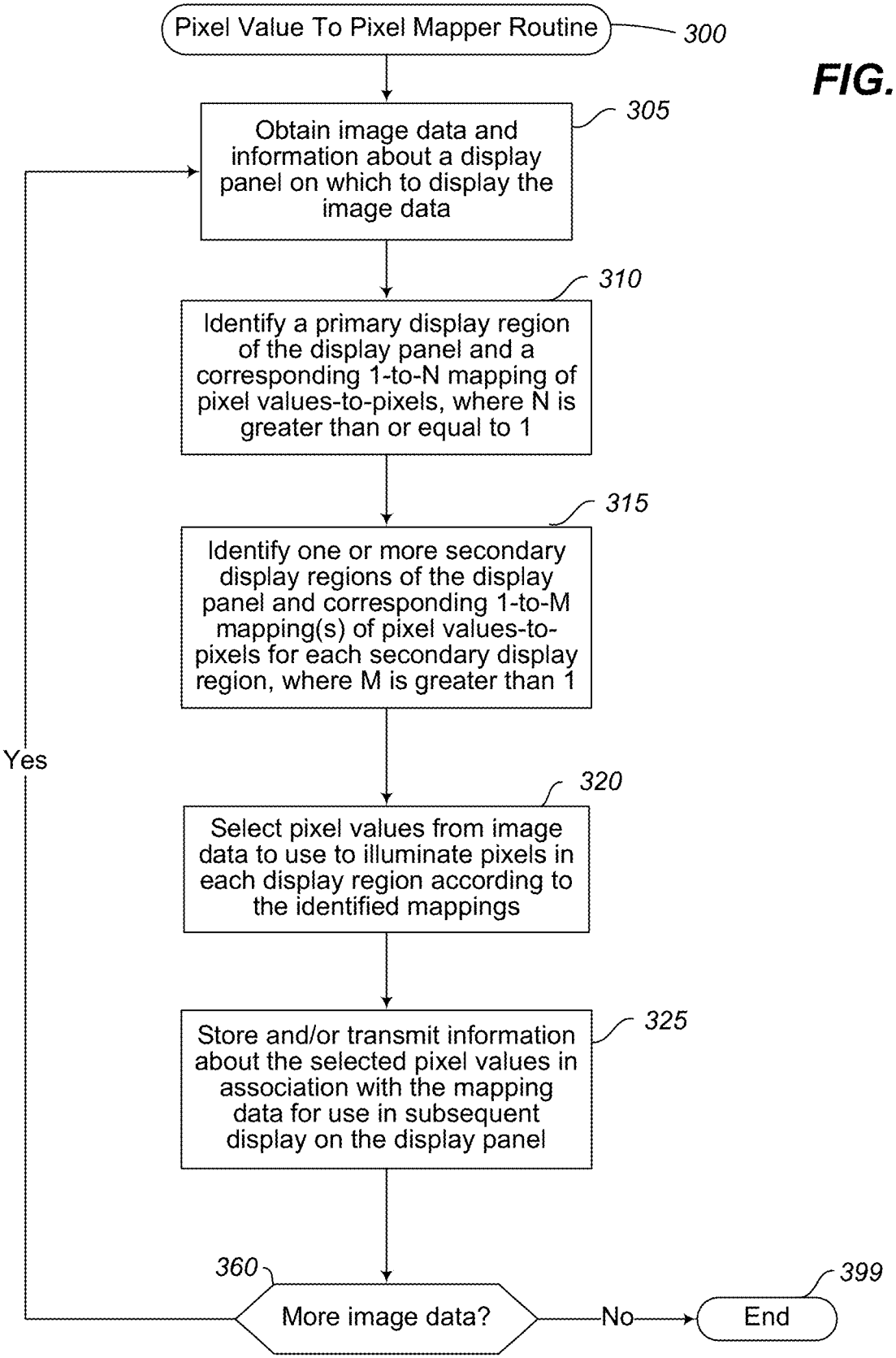
FIG. 3 is a flow diagram of an example embodiment of an Image Data Pixel Value To Pixel Mapper routine of an IDM system.

FIG. 3 is a flow diagram of an example embodiment of a Pixel Value to Pixel Mapper routine 300. The routine 300 may be performed by, for example, the Image Data Pixel Value To Pixel Mapper component 139 of FIG. 1A and/or a system performing operations for encoding image data as discussed with respect to FIGS. 2A-2C and elsewhere herein, such as to encode image data in accordance with a determined pixel arrangement structure with at least one primary display region and one or more secondary display regions. While the illustrated embodiment of the routine 300 discusses performing operations for a single image at a time, it will be appreciated that the operations of the routine 300 may be applied to sequences of multiple images (e.g., multiple consecutive video frames). It will also be appreciated that the illustrated embodiment of the routine may be implemented in software and/or hardware as appropriate, and may be performed by, for example, a system operating on an HMD or on another separate computing device.

The illustrated embodiment of the routine 300 begins at block 305, where the routine obtains image data and information about a display panel on which to display that image data. In blocks 310 and 315, the routine identifies the display regions to use for encoding the data, such as by receiving information about the arrangement to use in block 305 (e.g., a fixed structure to use for all images), or instead by dynamically determining the structure to use based on current context (e.g., received information about a portion of the image of emphasis, such as from gaze tracking of a viewer, information from a program generating or otherwise providing the image, etc.). In particular, the routine in block 310 identifies a primary display region of the display panel and a corresponding 1-to-N mapping of pixel-values-to-pixels, with N being greater than or equal to 1, and identifies one or more secondary display regions of the display panel in block 315 with corresponding 1-to-M pixel mappings of pixel-values-to-pixels for each, with M being greater than 1 (reflecting a 1-to-multiple pixel mapping).

The routine then proceeds to block 320, where it selects pixel values from the obtained image data to be used to illuminate pixels within each display region in accordance with the identified 1-to-N and 1-to-M pixel mappings. In block 325, the routine then stores and/or transmits encoded information about the selected pixel values in association with the mapping data, for use in subsequent display on the display panel, such as in a manner similar to that discussed with respect to FIG. 4. The routine then proceeds to block 360 where it determines whether additional image data is to be obtained and encoded, such as to continue until an explicit indication to terminate is received. If so, the routine returns to block 305 to obtain the additional image data, and if not the routine proceeds to block 399 and ends.

Figure 4:
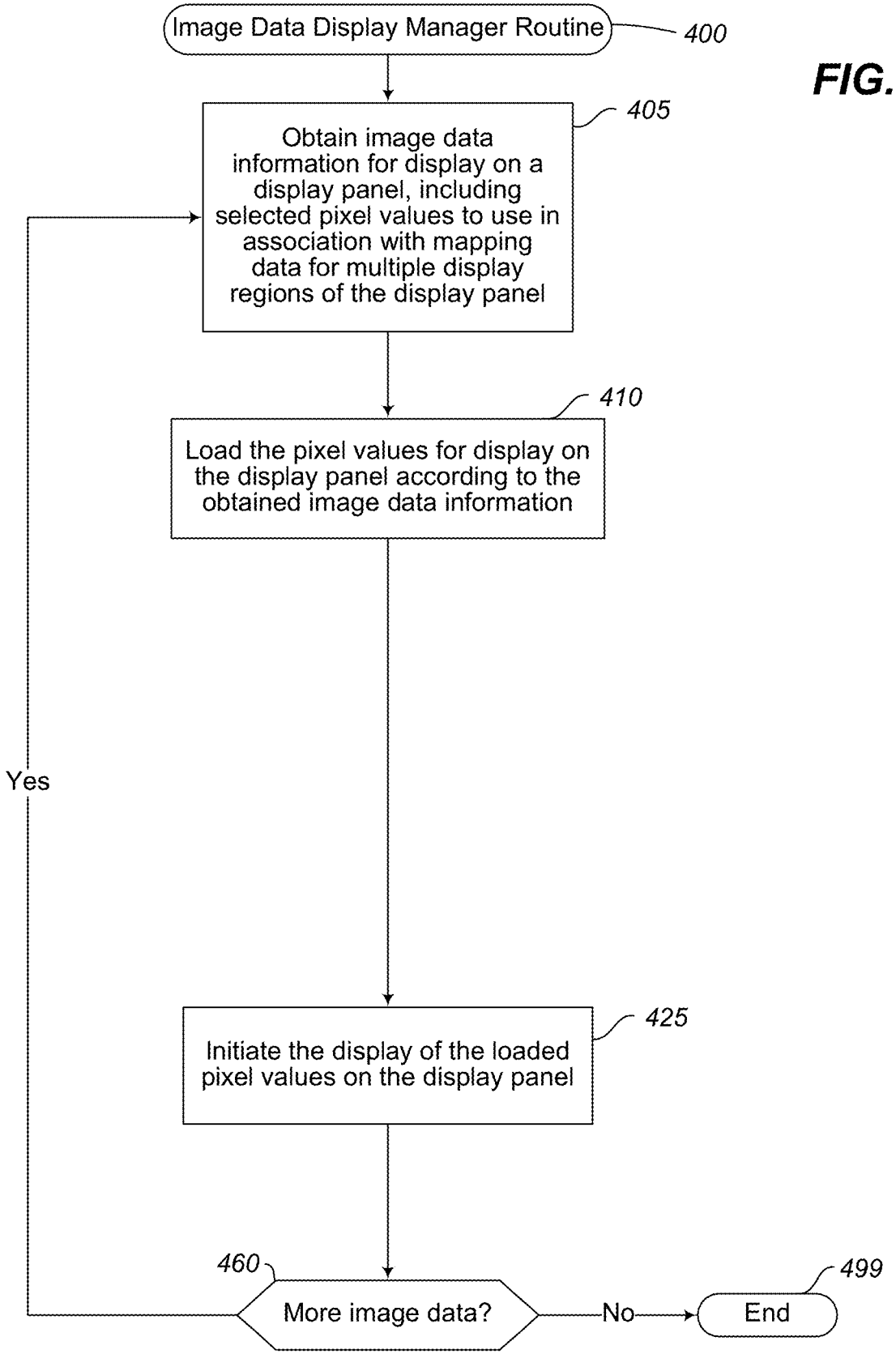
FIG. 4 is a flow diagram of an example embodiment of an Image Data Display Manager routine of an IDM system.

FIG. 4 is a flow diagram of an example embodiment of an Image Data Display Manager routine 400. The routine 400 may be performed by, for example, the Image Data Display Manager component 137 of FIG. 1A (e.g., as implemented on configured hardware circuits of an HMD device, such as in a manner discussed with respect to FIG. 1B) and/or a system performing operations for receiving and displaying encoding image data as discussed with respect to FIGS. 2A-2C and elsewhere herein, such as to receive image data that is encoded in accordance with a determined pixel arrangement structure with at least one primary display region and one or more secondary display regions, and to perform corresponding display operations on one or more display panels. While the illustrated embodiment of the routine 400 discusses performing operations for a single image at a time, it will be appreciated that the operations of the routine 400 may be applied to sequences of multiple images (e.g., multiple consecutive video frames). It will also be appreciated that the illustrated embodiment of the routine may be implemented in software and/or hardware as appropriate, and may be performed by, for example, a system operating on an HMD or on another separate computing device.

The illustrated embodiment of the routine 400 begins at block 405, where encoded image data information is obtained for display on an indicated display panel—the obtained image data includes selected pixel values to use in association with mapping data for multiple display regions of the indicated display panel, such as data encoded in a manner discussed with respect to FIG. 3. In some embodiments and situations, a defined structure of display regions for the display panel will be known or also obtained in block 405 (e.g., will be part of the encoded image data, such as for situations in which the structure may dynamically change for different images). Once the image data and display information is obtained, the routine proceeds to block 410, in which the routine loads the selected pixel values for display on the indicated display panel in accordance with the obtained image data information and the corresponding structure of display regions. The routine then proceeds to block 425, and initiates display of the loaded pixel values on the indicated display panel. The routine then proceeds to block 460 to determine whether additional image data information is to be obtained and displayed, such as to continue until an explicit indication to terminate is received. If so, the routine returns to block 405 to obtain the additional image data, and if not the routine proceeds to block 499 and ends.

It will be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel) and/or in a particular order, those skilled in the art will appreciate that in other embodiments the operations may be performed in other orders and in other manners. It will similarly be appreciated that the data structures discussed above may be structured in different manners, including for databases or user interface screens/pages or other types of data structures, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

In addition, the sizes and relative positions of elements in the drawings are not necessarily drawn to scale, including the shapes of various elements and angles, with some elements enlarged and positioned to improve drawing legibility, and the particular shapes of at least some elements being selected for ease of recognition without conveying information regarding the actual shape or scale of those elements. In addition, some elements may be omitted for clarity and emphasis. Furthermore, repeated reference numbers in different drawings may signify the same or similar elements.

From the foregoing it will be appreciated that, although specific embodiments have been described herein for purposes of illustration, various modifications may be made without deviating from the spirit and scope of the invention. In addition, while certain aspects of the invention are presented at times in certain claim forms, or may not be embodied in any claims at some times, the inventors contemplate the various aspects of the invention in any available claim form. For example, while only some aspects of the invention may be recited at a particular time as being embodied in a computer-readable medium, other aspects may likewise be so embodied.

What is claimed is:

1. A method comprising:
    acquiring, by one or more processors of one or more computing systems, video frame data that includes pixel value information for an associated video frame, wherein the pixel value information includes pixel values for a plurality of unidimensional pixel arrays of the associated video frame, and wherein each unidimensional pixel array is an addressable pixel column or an addressable pixel row;
    encoding the video frame data by:
        determining, by the one or more processors, a first position for a primary display region of a display panel on which to display the associated video frame, and multiple second positions for multiple secondary display regions of the display panel, and identifying a pixel value-to-pixel mapping to use for each of the multiple secondary display regions;
        identifying, by the one or more processors, a first portion of the associated video frame corresponding to the determined first position of the primary display region, and multiple second portions of the associated video frame corresponding to the multiple secondary display regions, each of the multiple second portions including two or more unidimensional pixel arrays of the plurality of unidimensional pixel arrays; and
        modifying, for each of the multiple second portions, and for each of one or more first unidimensional pixel arrays of the two or more unidimensional pixel arrays included in the second portion, pixel values to use for the second portion in the encoded video frame data by assigning pixel values from the first unidimensional pixel array to pixels of one or more second unidimensional pixel arrays of the two or more unidimensional pixel arrays included in the second portion that are adjacent to the first unidimensional pixel array, so that the modified pixel values to use for the second portion include multiple pixel clusters according to the pixel value-to-pixel mapping for the second portion that each have a single pixel value for all pixels in the pixel cluster;
    transmitting the encoded video frame data to at least one controller for the display panel; and
    displaying, under control of the at least one controller, the encoded video frame data on the display panel, including using pixel values of the first portion of the associated video frame to control display of pixels in the primary display region at the first position of the display panel, and using the modified pixel values for each of the multiple second portions to control display of pixels in the multiple secondary display regions at the multiple second positions of the display panel.

2. The method of claim 1 wherein the acquiring and the encoding and the transmitting and the displaying are performed for each of a succession of multiple video frames, and wherein the determining of the first position for the primary display region is performed dynamically for each video frame based at least in part on current data corresponding to the video frame.

3. The method of claim 1 wherein the identifying of the pixel value-to-pixel mapping to use for each of the multiple secondary display regions is based at least in part on an available bandwidth transmission capacity for the transmitting of the encoded video frame data.

4. The method of claim 1 wherein the identifying of the pixel value-to-pixel mapping to use for each of the multiple secondary display regions is based on at least one a target effective resolution or a target amount of data in the encoded video frame data.

5. A method comprising:
    receiving, by one or more configured hardware circuits, data that includes a plurality of pixel values for use in controlling display of pixels in a display panel to display an image;
    determining, for a primary display region of the display panel having a first subset of the pixels and being associated with a 1-to-1 mapping of pixel values-to-pixels, first pixel values of the plurality that are for use in controlling display of the pixels of the first subset and that are equal in quantity to the pixels of the first subset;
    determining, for at least one secondary display region of the display panel having at least one second subset of the pixels and being associated with at least one 1-to-multiple mapping of pixel values-to-pixels, second pixel values of the plurality that are for use in controlling display of the pixels of the at least one second subset and that are less in quantity than the pixels of the at least one second subset; and
    initiating, by the one or more configured hardware circuits, display of the image on the display panel using the 1-to-1 mapping for the primary display region and the at least one 1-to-multiple mapping for the at least one secondary display region, including to use each of the determined first pixel values to control display of one of the pixels of the first subset for the primary display region, and to use each of the determined second pixel values to control display of multiple of the pixels of the at least one second subset for the at least one secondary display region.

6. The method of claim 5 wherein the pixels in the display panel are in a plurality of unidimensional pixel arrays arranged in an array with multiple rows and multiple columns, and wherein the initiating of the display of the image on the display panel using the at least one 1-to-multiple mapping for the at least one secondary display region includes, for each of one or more first unidimensional pixel arrays of the plurality of unidimensional pixel arrays, assigning pixel values associated with the first unidimensional pixel array to pixels of the first unidimensional pixel array and to pixels of one or more adjacent second unidimensional pixel arrays.

7. The method of claim 5 wherein a 1-to-multiple mapping for a first secondary display region of the at least one secondary display region includes a 1-to-N mapping where N is a specified quantity of multiple pixels for each pixel value, and wherein the initiating of the display of the image on the display panel includes, for each determined second pixel value for the first secondary display region, identifying a cluster of N pixels in the first secondary display region, and assigning the determined second pixel value to each of the N pixels of the identified cluster.

8. The method of claim 5 wherein the received data is a non-encoded version of the image that includes a pixel value for each pixel of the image, and wherein the determining of the second pixel values for use in controlling display of the pixels of the at least one second subset includes, for each portion of the image corresponding to a secondary display region of the display panel, repeatedly replacing multiple pixel values in the received data with a determined second pixel value that represents the replaced multiple pixel values.

9. The method of claim 8 further comprising, before the determining of the first pixel values and the determining of the second pixel values, determining locations of the primary display region for the display panel and of the at least one secondary display region of the display panel, and wherein the determining of the first pixel values and the determining of the second pixel values is performed by one or more configured hardware circuits and further includes using the determined locations to determine the multiple pixel values to repeatedly replace with a determined second pixel value.

10. The method of claim 5 wherein the received data is an encoded version of the image that has less data than an original non-encoded version of the image, and wherein the determining of the first pixel values and the determining of the second pixel values includes retrieving, from the encoded version of the image, the first pixel values and an indication of a first association of the first pixel values with the primary display region, and the second pixel values and an indication of a second association of the second pixel values with the at least one secondary display region.

11. The method of claim 10 further comprising, before the receiving of the data:
generating, by one or more hardware processors, the encoded version of the image by modifying the non-encoded version of the image to, for each portion of the image corresponding to a secondary display region of the display panel, repeatedly replace multiple pixel values for the portion of the image with a determined second pixel value that represents the replaced multiple pixel values in the encoded version of the image; and
transmitting the encoded version of the image over one or more network connections to the one or more computing systems.

12. The method of claim 11 wherein the generating of the encoded version of the image further includes:
obtaining, for each secondary display region of the display panel, information about a position of the secondary display region that includes a size of the secondary display region; and
using the obtained information about the position during the generating, and including information in the encoded version of the image to associate each determined second pixel value with one of the at least one secondary display regions.

13. The method of claim 11 further comprising, before the repeated replacing of the multiple pixel values with a determined second pixel value for each portion of the image corresponding to a secondary display region of the display panel:
determining position information for the primary display region for the display panel and for the at least one secondary display region of the display panel, including locations of the primary display region and of the at least one secondary display region; and
using the determined position information during the generating.

14. The method of claim 11 further comprising, before the repeated replacing of the multiple pixel values with a determined second pixel value for each portion of the image corresponding to a secondary display region of the display panel, determining a bandwidth transmission capacity to use for the transmitting of the encoded version of the image, and selecting one or more 1-to-multiple mappings to use for the repeated replacing based at least in part on the determined bandwidth transmission capacity.

15. The method of claim 11 further comprising, before the repeated replacing of the multiple pixel values with a determined second pixel value for each portion of the image corresponding to a secondary display region of the display panel, determining an amount of data reduction of the encoded version of the image in comparison to the non-encoded version of the image, and selecting one or more 1-to-multiple mappings to use for the repeated replacing based at least in part on the determined amount of data reduction.

16. The method of claim 11 further comprising, before the repeated replacing of the multiple pixel values with a determined second pixel value for each portion of the image corresponding to a secondary display region of the display panel, determining an amount of data in the encoded version of the image, and selecting one or more 1-to-multiple mappings to use for the repeated replacing to reach the determined amount of data.

17. The method of claim 11 wherein the replacing of multiple pixel values with a determined second pixel value that represents the replaced multiple pixel values includes combining at least some of the multiple pixel values to generate the determined second pixel value.

18. The method of claim 11 wherein the replacing of multiple pixel values with a determined second pixel value that represents the replaced multiple pixel values includes determining one of the multiple pixel values to use as the determined second pixel value.

19. The method of claim 11 wherein the at least one secondary display region of the display panel includes at least one first secondary display region associated with a first pixel color and at least one second secondary display region associated with a second pixel color, and wherein the generating of the encoded version of the image includes using different 1-to-multiple mappings of pixel values-to-pixels for the at least one first secondary display region and the at least one second secondary display region.

20. The method of claim 11 wherein the at least one secondary display region of the display panel includes at least one first secondary display region that provides high dynamic range capabilities and at least one second secondary display region that does not provide high dynamic range capabilities, and wherein the generating of the encoded version of the image includes using different 1-to-multiple mappings of pixel values-to-pixels for the at least one first secondary display region and the at least one second secondary display region.

21. The method of claim 11 wherein the generating of the encoded version of the image further includes applying, to at least one portion of the image for at least one secondary display region, image filtering to adjust contrast to reflect frequency modulation response, and not applying the image filtering to at least one other portion of the image for at least one other display region.

22. The method of claim 11 further comprising adjusting, for at least one portion of the image corresponding to at least part of a border between two display regions with two different mappings of pixel values-to-pixels, pixel values in the at least one portion to simulate an additional mapping of pixel values-to-pixels that is intermediate between the two different mappings of pixel values-to-pixels, and wherein the adjusting is performed as part of at least one of the generating of the encoded version of the image or the display of the image on the display panel.

23. The method of claim 5 further comprising tracking a gaze of a viewer of the display panel during display of one or more previous images before the image, identifying a location of the display panel to which the tracked gaze corresponds, and dynamically determining, for the image, the primary display region of the display panel based on the identified location.

24. The method of claim 5 further comprising displaying one or more previous images before the image, identifying a portion of the image based on content of the image, identifying a location of the display panel to which the identified portion of the image corresponds, and dynamically determining, for the image, the primary display region of the display panel based on the identified location.

25. The method of claim 5 wherein the one or more computing systems include a gaming system, wherein the image is a frame of video generated by an executing game program, and wherein the display frame is part of a virtual-reality head-mounted display device.

26. A system, comprising:
a display panel with multiple pixels; and
one or more hardware circuits configured to cause the system to perform automated operations that include at least:
receiving data that includes a plurality of pixel values for use in controlling display of the multiple pixels in the display panel to display an image;
determining, for a primary display region of the display panel having a first subset of the multiple pixels and being associated with a first mapping of pixel values-to-pixels, first pixel values of the plurality that are for use in controlling display of the pixels of the first subset;
determining, for at least one secondary display region of the display panel having at least one second subset of the multiple pixels and being associated with at least one second mapping of pixel values-to-pixels that is different from the first mapping, second pixel values of the plurality that are for use in controlling display of the pixels of the at least one second subset and that are less in quantity than the pixels of the at least one second subset; and
initiating display of the image on the display panel using the first mapping for the primary display region and the at least one second mapping for the at least one secondary display region, including to use each of the determined first pixel values to control display of at least one of the pixels of the first subset for the primary display region, and to use the determined second pixel values to control display of the pixels of the at least one second subset for the at least one secondary display region.

27. The system of claim 26 further comprising one or more memories with stored instructions that, upon execution by at least one of the one or more configured hardware circuits, cause the system to perform at least some of the automated operations.

28. The system of claim 26 further comprising a second display panel, wherein the system is part of a head-mounted display device that houses the display panel in a position viewable by one eye of a wearer of the head-mounted display device and that houses the second display panel in a position viewable by another eye of the wearer, and wherein the automated operations further include initiating display of a second image on the second display panel simultaneously with the display of the image on the display panel, wherein the initiating of the display of the second image includes using multiple distinct mappings of pixel values of the second image to pixels of the second display panel for multiple display regions of the second display panel.

29. The system of claim 26 further comprising a computing device that is separated from the one or more configured hardware circuits by at least one network connection and that is configured to execute a software application generating a sequence of multiple video frames for display on the display panel and to encode each of the multiple video frames before transmission over the at least one network connection to the one or more configured hardware circuits, wherein the image is one of multiple video frames, and wherein the receiving and the determining of the first pixel values and the determining of the second pixel values and the initiating of the display are performed for each of the multiple video frames.

30. The system of claim 29 wherein the automated operations further include using, for at least one of the video frames separate from the image, at least one third mapping of pixel values-to-pixels that is different from the first mapping and from the at least one second mapping, wherein the first mapping includes a 1-to-L mapping of pixel values-to-pixels where L is at least 1, wherein the at least one second mapping includes a 1-to-M mapping of pixel values to pixels where M is greater than 1, and wherein the at least one third mapping includes a 1-to-N mapping of pixel values to pixels where N is different than L and is different than M.

31. The system of claim 26 wherein the pixels of the first subset for the primary display region of the display panel are of a first size, and wherein the pixels of the at least one second subset for the at least one secondary display region of the display panel are of at least one second size different from the first size.

* * * * *